United States Patent
Miyauchi et al.

(10) Patent No.: US 8,640,010 B2
(45) Date of Patent: Jan. 28, 2014

(54) DECODING APPARATUS AND DECODING METHOD

(75) Inventors: Toshiyuki Miyauchi, Kanagawa (JP); Masayuki Hattori, Kanagawa (JP); Takashi Yokokawa, Kanagawa (JP)

(73) Assignee: Sony Corporation, Tokyo (JP)

( * ) Notice: Subject to any disclaimer, the term of this patent is extended or adjusted under 35 U.S.C. 154(b) by 832 days.

(21) Appl. No.: 12/335,802

(22) Filed: Dec. 16, 2008

(65) Prior Publication Data

US 2009/0158127 A1 Jun. 18, 2009

(30) Foreign Application Priority Data

Dec. 18, 2007 (JP) ................ P2007-326156

(51) Int. Cl.
*G06F 11/00* (2006.01)

(52) U.S. Cl.
USPC ............................ 714/780; 714/752; 714/784

(58) Field of Classification Search
None
See application file for complete search history.

(56) References Cited

U.S. PATENT DOCUMENTS

| 6,381,726 B1 * | 4/2002 | Weng | 714/780 |
|---|---|---|---|
| 6,708,308 B2 * | 3/2004 | De Souza et al. | 714/795 |
| 2001/0019522 A1 * | 9/2001 | Mita et al. | 369/47.19 |
| 2006/0140311 A1 * | 6/2006 | Ashley et al. | 375/341 |
| 2006/0192691 A1 * | 8/2006 | Kan et al. | 341/50 |

FOREIGN PATENT DOCUMENTS

| JP | 2000 232379 | 8/2000 |
|---|---|---|
| JP | 2006 238127 | 9/2006 |

OTHER PUBLICATIONS (Seiichi Mita and Terumi Takashi, "A PRML and EPRML Spliced Operation Scheme Designed to Reduce Power Dissipation of Read Channel Chips," IEEE Transactions on Magenetics, vol. 34, No. 1, Jan. 1998, 153-159).*

* cited by examiner

*Primary Examiner* — Scott Baderman
*Assistant Examiner* — Jason Bryan
(74) *Attorney, Agent, or Firm* — Frommer Lawrence & Haug LLP; William S. Frommer

(57) ABSTRACT

Disclosed herein is a decoding apparatus that performs soft-decision decoding on a linear block code, the apparatus including a hard-decision decoder configured to perform hard-decision decoding on a received word using a hard-decision decoding algorithm; and a soft-decision decoder configured to perform, using a soft-decision algorithm, soft-decision decoding merely on a received word for which the hard-decision decoder has failed in the hard-decision decoding.

12 Claims, 3 Drawing Sheets

F I G . 1
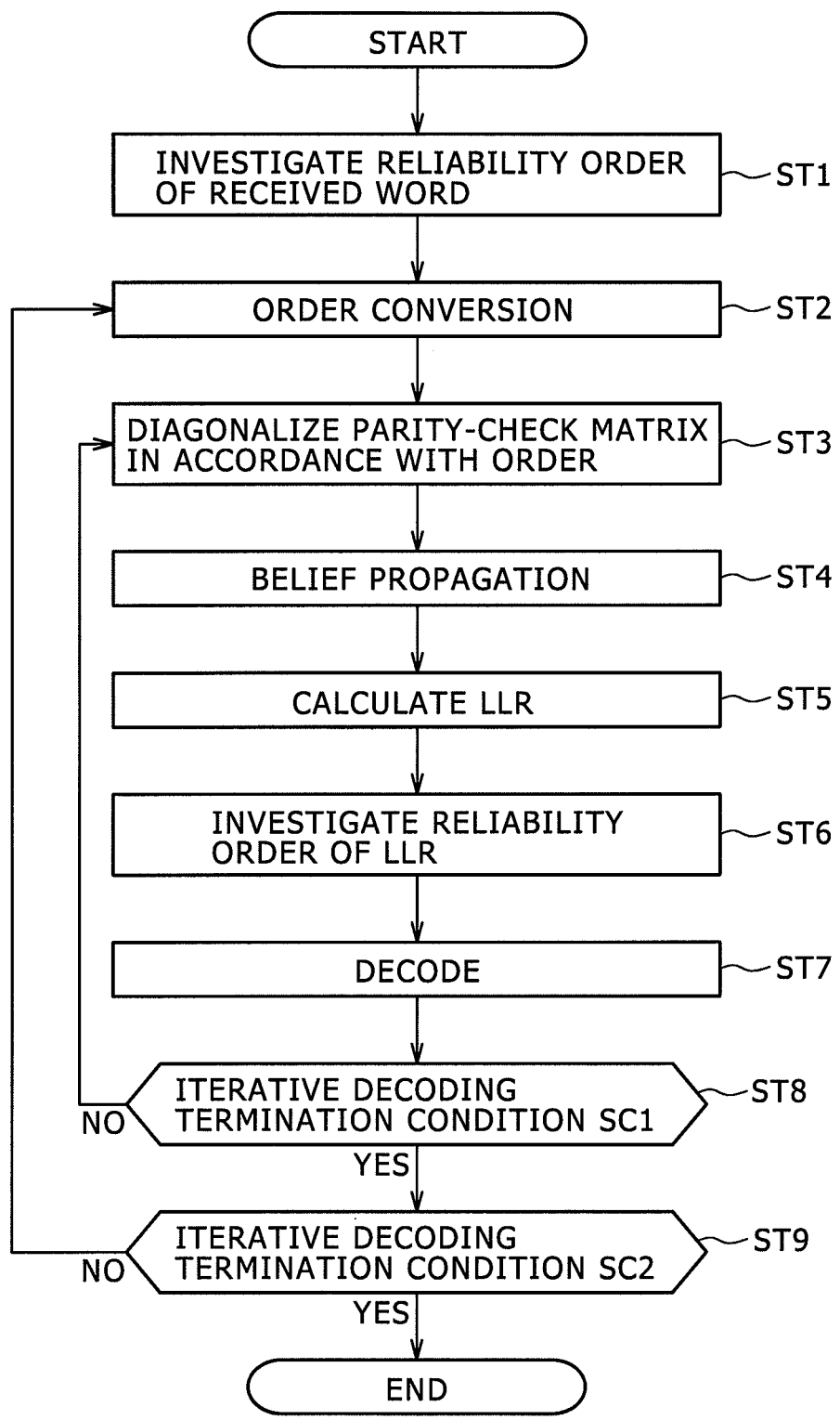

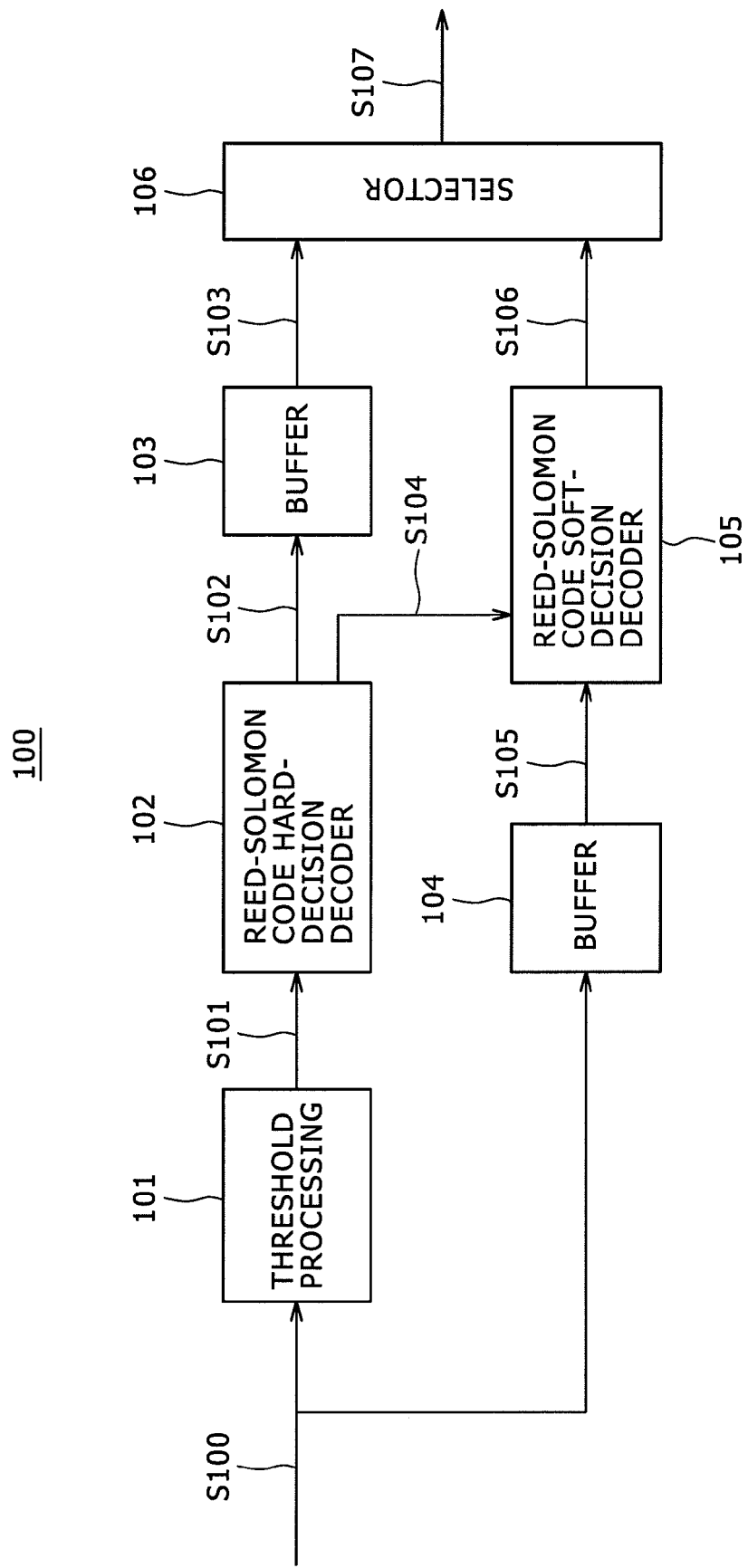

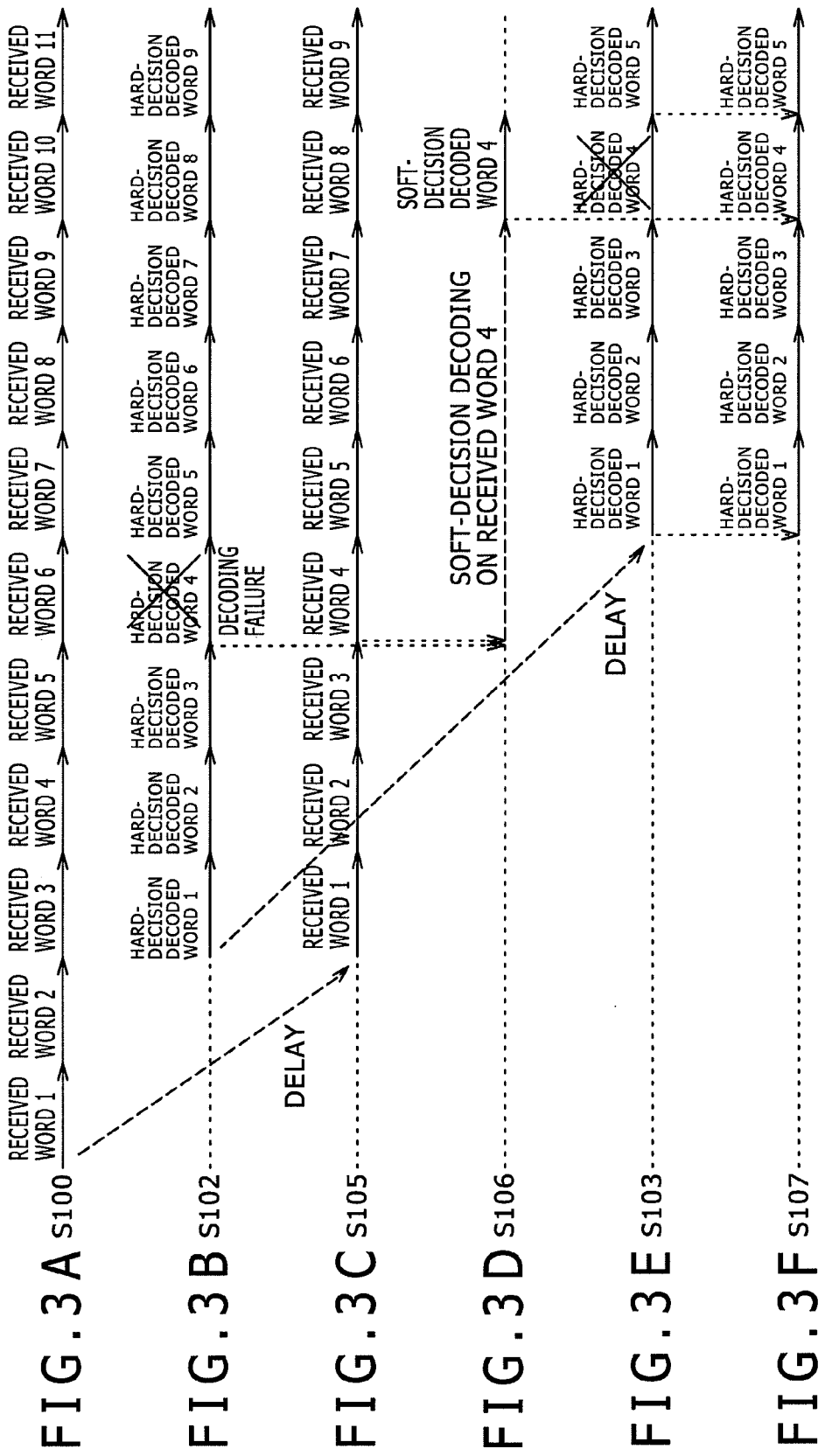

DECODING APPARATUS AND DECODING METHOD

CROSS REFERENCES TO RELATED APPLICATIONS

The present invention contains subject matter related to Japanese Patent Application JP 2007-326156 filed in the Japan Patent Office on Dec. 18, 2007, the entire contents of which being incorporated herein by reference.

BACKGROUND OF THE INVENTION

1. Field of the Invention

The present invention relates to a decoding apparatus and a decoding method that are applicable to a digital broadcast receiver, an optical disc playback apparatus, and the like for achieving an error correction coding technology using an algebraic technique, for example.

2. Description of the Related Art

For algebraic geometric codes, such as Reed-Solomon codes and BCH codes, which are subfield subcodes of the Reed-Solomon codes, high-performance and low-computational cost decoding methods employing their algebraic properties are known.

Suppose, for example, that a Reed-Solomon code having a code length n, an information length k, a field of definition $GF(q)$ ($q=p^m$, p: a prime number), and a minimum distance $d=n-k$ is denoted as $RS(n, k)$. It is well known that minimum distance decoding (common decoding) of decoding a hard-decision received word into a code word having a minimum Hamming distance guarantees correction of t ($t<d/2$) erroneous symbols.

Guruswami-Sudan list decoding (hereinafter referred to as "G-S list decoding") guarantees correction of t ($t<\sqrt{nk}$) erroneous symbols (see V. Guruswami and M. Sudan, Improve decoding of Reed-Solomon and Algebraic-Geometry codes, IEEE Transactions on Information Theory, vol. 45, pp. 1757-1767, 1999).

Koetter-Vardy list decoding (hereinafter referred to as "K-V list decoding"), which is an extended version of the Guruswami-Sudan list decoding and uses a soft-decision received word, is, as with the Guruswami-Sudan list decoding, made up of the following four steps, (1) calculation of reliability of each symbol from received information; (2) extraction of two-variable polynomial interpolation conditions from the reliability; (3) interpolation of two-variable polynomials; and (4) factorization of interpolation polynomials and creation of a list of decoded words. It is known that the K-V list decoding has higher performance compared to when hard-decision decoding is applied (see R. Koetter and A. Vardy, Algebraic soft-decision decoding of Reed-Solomon codes, IEEE Transactions on Information Theory, 2001).

It is also known that computational cost thereof can be reduced to a practical level by re-encoding (see R. Koetter, J. Ma, A. Vardy, and A. Ahmed, Efficient Interpolation and Factorization in Algebraic Soft-Decision Decoding of Reed-Solomon codes, Proceedings of ISIT 2003).

As to linear codes, low-density parity-check codes (LDPC codes) capable of achieving high performance, nearly marginal performance, through iterative decoding using belief propagation (BP) have been recently attracting attention (see D. MacKay, Good Error-Correcting Codes Based on Very Sparse Matrices, IEEE Transactions on Information Theory, 1999).

It is theoretically known that the belief propagation (BP) used in the LDPC codes is generally effective merely for linear codes having a low-density parity-check matrix. Also, it is known that reducing the density of a parity-check matrix of the Reed-Solomon codes or the BCH codes is NP-hard (see Berlekamp, R. McEliece, and H. van Tilborg, On the inherent intractability of certain coding problems, IEEE Transactions on Information Theory, vol. 24, pp. 384-386, May, 1978).

Thus, it has been considered difficult to apply the belief propagation (BP) to the Reed-Solomon codes or the BCH codes.

However, in 2004, Narayanan et al. suggested that application of the belief propagation (BP) to the Reed-Solomon codes, the BCH codes, or linear codes having a parity-check matrix that is not low in density using a parity-check matrix as diagonalized in accordance with the reliability of a received word is effective (see Jing Jiang and K. R. Narayan, Soft Decision Decoding of RS Codes Using Adaptive Parity Check Matrices, Proceeding of IEEE International Symposium on Information Theory 2004).

This technique is called adaptive belief propagation (ABP) decoding.

FIG. 1 is a flowchart illustrating ABP decoding that has been proposed.

At step ST1, a reliability order of the received word is investigated, and at step ST2, order conversion is performed.

At step ST3, a parity-check matrix is diagonalized in accordance with the converted order, and at step ST4, the belief propagation (BP) is performed using the resulting parity-check matrix.

Next, LLR is calculated at step ST5, a reliability order of the calculated LLR is investigated at step ST6, and decoding is performed at step ST7.

Thereafter, the above procedure is performed iteratively until iterative decoding termination conditions SC1 and SC2 are satisfied at steps ST8 and ST9.

SUMMARY OF THE INVENTION

Linear block codes, typified by the Reed-Solomon codes, are widely used as an error-correcting code for digital broadcasting and optical disc standards.

As a decoding algorithm for the linear block codes, a decoding algorithm called bounded distance decoding is commonly used. In this bounded distance decoding, a decoding operation is performed based on a hard-decision received value, i.e., a received value in which each bit is quantized to zero or one (this quantization is referred to as "hard decision").

In contrast, in the case where convolution codes are subjected to Viterbi decoding, for example, the decoding operation is commonly performed using a received value that has been subjected to quantization with gradations (this quantization is referred to as "soft decision"), when the received value has passed through a communication channel allowing continuous values.

This decoding method is called soft-decision decoding. In the case of the Viterbi decoding for the convolution codes, for example, it is known that the soft-decision decoding achieves a coding gain of 2 to 3 dB relative to the hard-decision decoding.

Accordingly, there has been an attempt in recent years to employ the soft-decision decoding for the received value that has passed through the communication channel allowing continuous values, even in the case of the linear block codes such as the Reed-Solomon code, in order to improve decoding performance.

Several different algorithms have been proposed as soft-decision decoding algorithms for the linear block codes. One of such algorithms is the ABP decoding, proposed by J. Jiang and K. R. Narayanan. The ABP decoding is considered prospective as a decoding algorithm that achieves a coding gain of approximately 1 dB with a practical amount of computation.

However, all of the soft-decision algorithms for the linear block codes, including the ABP decoding algorithm, involve a higher amount of computation than the bounded distance decoding as known. Therefore, in order to realize real-time processing at a playback rate of a broadcast receiver or an optical disc, it is necessary to have computing units in parallel within a decoder or to provide a plurality of decoders, thus improving throughput, for example.

In general, this inevitably results in a significant increase in circuit scale, in comparison to a decoder that is based on any known bounded distance decoding algorithm.

As described above, any soft-decision decoder with a high throughput designed for the linear block codes has a disadvantage of the significant increase in circuit scale, compared to the decoder that is based on any known bounded distance decoding algorithm.

The embodiment of the present invention addresses the above-identified, and other problems associated with existing methods and apparatuses, and provides a decoding apparatus and a decoding method that make it possible to significantly reduce the circuit scale of the decoder, compared to that of any known soft-decision decoder, while ensuring improved decoding performance of the soft-decision decoding.

According to one embodiment of the present invention, there is provided a decoding apparatus that performs soft-decision decoding on a linear block code, the apparatus including a hard-decision decoder configured to perform hard-decision decoding on a received word using a hard-decision decoding algorithm; and a soft-decision decoder configured to perform, using a soft-decision algorithm, soft-decision decoding merely on a received word for which the hard-decision decoder has failed in the hard-decision decoding.

According to another embodiment of the present invention, there is provided a decoding method for performing soft-decision decoding on a linear block code, the method including the steps of first applying a hard-decision decoding algorithm to a received word to perform hard-decision decoding on the received word; and applying a soft-decision algorithm merely to a received word for which the hard-decision decoding may be impossible to perform the soft-decision decoding on that received word.

The proportion of received words that may not be decoded with a hard-decision algorithm to the whole received words is generally very small. Thus, according to the embodiment of the present invention, the soft-decision decoding employing the soft-decision algorithm may take a period of time corresponding to a plurality of code words for one received word. This eliminates the need to parallelize computing units within the decoder, the need to provide a plurality of decoders, and so on.

According to the embodiment of the present invention, it is possible to reduce the circuit scale of the decoder significantly relative to any known soft-decision decoder, while maintaining improved decoding performance of the soft-decision decoding.

BRIEF DESCRIPTION OF THE DRAWINGS

FIG. 1 is a flowchart illustrating ABP decoding that has been proposed;

FIG. 2 is a block diagram illustrating an exemplary structure of a soft-decision decoding apparatus designed for a linear block code and which adopts a decoding method according to one embodiment of the present invention; and FIGS. 3A to 3F show a timing diagram in the case where, in the soft-decision decoding apparatus as shown in FIG. 2, bounded distance decoding after hard decision for received word ends in failure.

DETAILED DESCRIPTION OF THE PREFERRED EMBODIMENT

Hereinafter, an embodiment of the present invention will be described in conjunction with the accompanying drawings.

FIG. 2 is a block diagram illustrating an exemplary structure of a soft-decision decoding apparatus 100 designed for a linear block code and which adopts a decoding method according to one embodiment of the present invention.

As shown in FIG. 2, the soft-decision decoding apparatus 100 according to the present embodiment includes a threshold processing circuit 101, a Reed-Solomon code hard-decision decoder 102, buffers 103 and 104, a Reed-Solomon code soft-decision decoder 105, and a selector 106.

In addition, "S100" refers to a soft received value signal, "S101" refers to a hard received value signal, "S102" refers to a hard-decision decoded word signal, "S103" refers to a delayed hard-decision decoded word signal, "S104" refers to a hard-decision decoding failure signal, "S105" refers to a delayed soft received value signal, "S106" refers to a soft-decision decoded word signal, and "S107" refers to a decoding result signal.

In the soft-decision decoding apparatus 100 as shown in FIG. 2, the soft received value signal S100 is inputted to the threshold processing circuit 101.

The threshold processing circuit 101 performs threshold processing on the inputted soft received value signal S100, and outputs the resulting hard received value signal S101.

The hard received value signal S101 is inputted to the Reed-Solomon code hard-decision decoder 102.

The Reed-Solomon code hard-decision decoder 102 subjects the inputted hard received value signal S101 to bounded distance decoding, and outputs the resulting hard-decision decoded word signal S102.

In the case where it may be impossible to correct an error present in the inputted hard received value signal S101 using the bounded distance decoding, the Reed-Solomon code hard-decision decoder 102 outputs the hard-decision decoding failure signal S104.

The hard-decision decoded word signal S102 is inputted to the buffer 103. The buffer 103 stores the hard-decision decoded word signal S102 in a memory primarily, and, after delaying the data by a delay time of the Reed-Solomon code soft-decision decoder 105, outputs the delayed hard-decision decoded word signal S103.

Meanwhile, the soft received value signal S100 is inputted to the buffer 104 as well.

The buffer 104 stores the soft received value signal S100 in a memory temporarily, and, after delaying the data by a delay time of the Reed-Solomon code hard-decision decoder 102, outputs the delayed soft received value signal S105.

The delayed soft received value signal S105 is inputted to the Reed-Solomon code soft-decision decoder 105.

Merely when the hard-decision decoding failure signal S104 has been inputted from the Reed-Solomon code hard-decision decoder 102 to the Reed-Solomon code soft-decision decoder 105, the Reed-Solomon code soft-decision decoder 105 performs soft-decision decoding on the delayed soft received value signal S105 based on the ABP decoding, for example, and outputs the resulting soft-decision decoded word signal S106. This soft-decision decoding takes a period of time corresponding to a plurality of received words.

The delayed hard-decision decoded word signal S103 and the soft-decision decoded word signal S106 are both inputted to the selector 106.

As a decoded word for any received word that has been hard-decision decoded successfully, the selector 106 selects the delayed hard-decision decoded word signal S103, whereas as a decoded word for any received word that has not been hard-decision decoded successfully, the selector 106 selects the soft-decision decoded word signal S106. The selector 106 outputs the selected signal as the decoding result signal S107.

Next, an operation of the soft-decision decoding apparatus 100 as shown in FIG. 2 will now be described below with reference to a timing diagram of FIGS. 3A to 3F.

FIGS. 3A to 3F show a timing diagram in the case where, in the soft-decision decoding apparatus 100 as shown in FIG. 2, the bounded distance decoding after the hard decision for received word 4 ends in failure. It is assumed in this example that the soft-decision decoding takes a period of time corresponding to four code words.

FIG. 3A shows the soft received value signal S100. FIG. 3B shows the hard-decision decoded word signal S102. FIG. 3C shows the delayed soft received value signal S105. FIG. 3D shows the soft-decision decoded word signal S106. FIG. 3E shows the delayed hard-decision decoded word signal S103. FIG. 3F shows the decoding result signal S107.

As shown in FIGS. 3A to 3F, in the circuit according to this embodiment of the present invention, the soft-decision decoding is applied merely when the bounded distance decoding after the hard decision has ended in failure. Thus, after all received values are subjected to error correction, final decoded words can be outputted in chronological order.

Here, in the above example, the soft-decision decoding takes the period of time corresponding to four code words. This means that the throughput of the Reed-Solomon code soft-decision decoder 105 may be as less as approximately a quarter of system throughput.

Accordingly, in the case where a plurality of soft-decision decoders are provided to achieve high throughput, the number of soft-decision decoders can be reduced to a quarter.

As a matter of course, in the case where received words for which the bounded distance decoding ends in failure come in succession, for example, one or more received words may not be subjected to the soft-decision decoding.

However, in actual applications such as a broadcast receiver and an optical disc player, the proportion of the received words for which the bounded distance decoding ends in failure to the whole received words is far less than $1/1000$.

Therefore, the probability that received words for which the bounded distance decoding ends in failure come in succession is negligibly small, and the decoding performance of the entire system would be little affected even if the soft-decision decoder were configured to desire a period of time corresponding to 100 code words to perform the soft-decision decoding on the delayed soft received value signal S105.

Thus, there is not a need to provide a plurality of soft-decision decoders to achieve high throughput. In general, the circuit scale of the soft-decision decoders is several times as large as that of hard-decision decoders. Therefore, elimination of the need to provide a plurality of soft-decision decoders results in a significant reduction in circuit scale of the entire system.

Moreover, while in the case where an ABP decoder is used as the soft-decision decoder, for example, a mechanism for parallel matrix diagonalization may be desired to achieve high throughput, the need for parallelization of computation within this type of soft-decision decoders is also eliminated.

Thus, a further reduction in circuit scale may be achieved.

Still further, common broadcast receivers, for example, have a buffer for smoothing a moving picture experts group (MPEG) transport stream at a final stage of a decoding section. Provision of such an output buffer within a system is not limited to the broadcast receivers but is common with various devices.

Accordingly, such an output buffer may be employed as the buffer 103 for the hard-decision decoded word signal S102 as shown in FIG. 2. This contributes to reducing the increase in the number of buffers.

In the above-described embodiment, the linear block code to be decoded is assumed to be the Reed-Solomon code. Note, however, that the linear block code to be decoded is not limited to the Reed-Solomon code but may be any linear block code.

As described above, the present embodiment eliminates the need to parallelize the computing units within the decoder, the need to provide a plurality of decoders, and so on. This contributes to reducing the circuit scale of the decoder as a whole significantly, while maintaining the decoding performance.

Note that the decoding method described in detail above can be formed as a program that accords with the above-described procedure and which is to be executed by a computer such as a CPU.

Also note that such a program may be stored in a storage medium such as a semiconductor memory, a magnetic disk, an optical disc, or a floppy (registered trademark) disk, so that a computer may access and execute the program when the storage medium is attached thereto.

It should be understood by those skilled in the art that various modifications, combinations, sub-combinations and alterations may occur depending on design requirements and other factor in so far as they are within the scope of the appended claims or the equivalents thereof.

What is claimed is:

1. A decoding apparatus that performs soft-decision decoding on a linear block code, the apparatus comprising:
   a hard-decision decoder configured to perform hard-decision decoding, utilizing a processor, on a received word using a hard-decision decoding algorithm and output a hard-decision decoded word signal and, when a hard-decision decoding process fails, a hard-decision decoding failure signal; and
   a soft-decision decoder configured to perform, using a soft-decision algorithm, soft-decision decoding on a received word for which said hard-decision decoder has failed in the hard-decision decoding, indicated by the hard-decision decoding failure signal being inputted into the soft-decision decoder,
   a hard-decision decoder buffer configured to receive the hard-decision decoded word signal and delay the hard-decision decoded signal by a first delay time corresponding to the decoding time of one word by the soft-decision decoder; and
   a soft-decision decoder buffer configured to delay the received word by a second delay time corresponding to the decoding time of one word by the hard-decision decoder and output the delayed received word to the soft-decision decoder so that when the hard-decision decoder outputs a hard-decision decoded word signal corresponding to a first received word, the soft-decision decoder starts to receive the same first received word, wherein when the soft-decision decoder performs a soft-decision decoding, both the hard-decision decoder buffer and the soft-decision decoder output a decoded signal corresponding to a same received word substantially at the same time, wherein the soft-decision decoder receives a soft-decision received value signal and, when the hard-decision decoding process fails, the hard-decision decoding failure signal, and wherein, when the soft-decision decoder receives both, the soft-decision received value signal and the hard-decision decoding failure signal, the soft-decision decoder performs soft-decision decoding.

2. The decoding apparatus according to claim 1, further comprising:

a selector configured to output a decoding result according to an order of original data, after said soft-decision decoder has completed the soft-decision decoding on the received word for which said hard-decision decoder has failed in the hard-decision decoding, wherein the delayed hard-decision decoded word signal and the soft-decision decoded word signal are both inputted to the selector, and wherein, as a decoding result for any received word that has been soft-decision decoded due to the soft-decision decoder receiving both, the soft-decision received value signal and the hard-decision decoding failure signal, the soft-decision decoded word signal is selected, and wherein, as a decoding result for any received word that was not soft-decision decoded due to the hard-decision decoder having performed hard-decision decoding on a received word, and not outputting the hard-decision decoding failure signal, the selector selects the delayed hard-decision decoded word signal.

3. The decoding apparatus according to claim 2, wherein an output buffer originally contained in a system is used as the hard-decision decoder buffer.

4. The decoding apparatus according to claim 1, wherein said sot decision decoder uses an adaptive belief propagation (ABP) decoding algorithm as the soft-decision algorithm.

5. The decoding apparatus according to claim 2, wherein said soft-decision decoder uses an adaptive belief propagation (ABP) decoding algorithm as the soft-decision algorithm.

6. The decoding apparatus according to claim 3, wherein said soft-decision decoder uses an adaptive belief propagation (ABP) decoding algorithm as the soft-decision algorithm.

7. A decoding method for performing soft-decision decoding on a linear block code, the method comprising the steps of:

first applying a hard-decision decoding algorithm to a received, word to perform hard-decision decoding on the received word and outputting a hard-decision decoded word signal and when a hard-decision decoding process thus, outputting a hard-decision decoding failure signal;

receiving, the hard-decision decoded word signal and, when a hard-decision decoding process fails, the hard-decision decoding failure signal; and applying a soft-decision algorithm to perform the soft-decision decoding on that received word when both, the soft-decision received value signal and the hard-decision decoding failure signal, are received;

delaying the hard-decision decoded signal by a first delay time corresponding to the decoding time of one word by the step of applying the soft-decision algorithm; and delaying the received word by a second delay time corresponding to the decoding time of one word by the step of applying the hard-decision decoding algorithm and outputting the delayed received word to the step of applying the soft-decision algorithm so that when the hard-decision decoding step outputs a hard-decision decoded word signal corresponding to a first received word, the soft-decision decoding step starts to receive the same first received word, wherein when the soft-decision algorithm is performed, the delayed hard-decision decoded signal and the soft-decision decoded signal correspond to a same received word and are output substantially at the same time.

8. The decoding method according to claim 7, further comprising:

selecting, a decoding result according to an order of original data after the soft-decision decoding on the received word has been completed, wherein the selecting step selects one of: a delayed hard-decision decoded word signal and a soft-decision decoded word signal, and wherein, as a decoding result for any received word that has been soft-decision decoded due to a soft-decision decoder receiving both, the soft-decision received value signal and the hard-decision decoding failure signal, the soft-decision decoded word signal is selected, and wherein, as a decoding result for any received word that was not soft-decision decoded due to a hard-decision decoder having performed hard-decision decoding on a received word, and not outputting the hard-decision decoding failure signal, the selector selects the delayed hard-decision decoded word signal; and outputting the decoding result.

9. The decoding method according to claim 8, wherein an output buffer originally contained in a system is used for storing the received word subjected to the hard-decision decoding.

10. The decoding method according to claim 7, wherein an adaptive belief propagation (ABP) decoding algorithm is used as the soft-decision algorithm.

11. The decoding method according to claim 8, wherein an adaptive belief propagation (ABP) decoding algorithm is used as the soft-decision algorithm.

12. The decoding method according to claim 9, wherein an adaptive belief propagation (ABP) decoding algorithm is used as the soft-decision algorithm.

* * * * *